United States Patent
Gehring et al.

(10) Patent No.: US 7,660,563 B2
(45) Date of Patent: Feb. 9, 2010

(54) APPARATUS AND METHOD FOR CALIBRATING MIXER OFFSET

(75) Inventors: Mark R. Gehring, Portland, OR (US); Brent R. Jensen, Hillsboro, OR (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 11/532,592

(22) Filed: Sep. 18, 2006

(65) Prior Publication Data

US 2007/0069928 A1    Mar. 29, 2007

Related U.S. Application Data

(60) Provisional application No. 60/720,857, filed on Sep. 26, 2005.

(51) Int. Cl.
  H03C 1/62   (2006.01)
  H04B 1/04   (2006.01)
  H04K 1/02   (2006.01)

(52) U.S. Cl. .............. 455/115.1; 455/114.2; 455/114.3; 455/63.1; 375/296

(58) Field of Classification Search .............. 455/114.2, 455/114.3, 115.1, 295, 296, 63.1; 375/296
See application file for complete search history.

(56) References Cited

U.S. PATENT DOCUMENTS

| | | | | |
|---|---|---|---|---|
| 5,381,108 | A * | 1/1995 | Whitmarsh et al. | 330/2 |
| 5,548,840 | A * | 8/1996 | Heck | 455/326 |
| 6,438,365 | B1 * | 8/2002 | Balteanu | 455/326 |
| 6,587,513 | B1 * | 7/2003 | Ichihara | 375/296 |
| 6,763,227 | B2 * | 7/2004 | Kramer | 455/115.1 |
| 7,065,154 | B2 * | 6/2006 | Ylamurto | 375/296 |
| 7,181,205 | B1 * | 2/2007 | Scott et al. | 455/423 |
| 2004/0095993 | A1 * | 5/2004 | Liu et al. | 375/219 |
| 2005/0141634 | A1 * | 6/2005 | Lin | 375/295 |
| 2005/0159130 | A1 * | 7/2005 | Yang et al. | 455/326 |
| 2006/0073803 | A1 * | 4/2006 | Igarashi et al. | 455/296 |
| 2006/0120493 | A1 * | 6/2006 | Huang et al. | 375/346 |
| 2006/0208769 | A1 * | 9/2006 | Sanduleanu et al. | 327/94 |
| 2006/0234664 | A1 * | 10/2006 | Chiu et al. | 455/285 |
| 2006/0258317 | A1 * | 11/2006 | Watanabe | 455/296 |
| 2007/0109028 | A1 * | 5/2007 | Craninckx | 327/113 |
| 2007/0132500 | A1 * | 6/2007 | Embabi et al. | 327/359 |

FOREIGN PATENT DOCUMENTS

| GB | 2213006 | * 11/1987 |
|---|---|---|
| JP | 2002-164947 | * 6/2002 |

OTHER PUBLICATIONS

PCT International Preliminary Report on Patent Liability (Chapter 1 of the PCT) for Int'l. Application No. PCT/US2006/037092, filing date Sep. 22, 2006, mailed Apr. 3, 2008, (2 pgs.).
PCT Written Opinion of the International Searching Authority for Int'l. Application No. PCT/US2006/037092, filing date Sep. 22, 2006, mailed Apr. 3, 2008, (3 pgs.).
International Search Report, PCT/US06/37092 filed Sep. 22, 2006, mailed Sep. 25, 2007.

* cited by examiner

*Primary Examiner*—Duc M Nguyen

(57) ABSTRACT

A circuit including a subcircuit having differential signals, and a feedback circuit coupled to the subcircuit. The feedback circuit is configured to measure an offset between the differential signals, to generate a calibration signal in response to the measurement, and to reduce the offset in response to the calibration signal.

17 Claims, 5 Drawing Sheets

APPARATUS AND METHOD FOR CALIBRATING MIXER OFFSET

CROSS-REFERENCE TO RELATED APPLICATIONS

This application claims priority under 35 U.S.C. §119(e) from U.S. Provisional Application Ser. No. 60/720,857, filed on Sep. 26, 2005, the contents of which are herein incorporated by reference in their entirety.

BACKGROUND

1. Technical Field

This disclosure relates generally to electronic circuits and, in particular, to circuits for frequency mixing.

2. Description of the Related Art

Wireless devices are becoming more and more popular as mobile communications and computing devices become ubiquitous. Some wireless devices use radio frequency communications to operate. In such wireless devices, radio frequency upconverters or mixers are important components.

Conventional upconverter or mixer circuits are used to convert a baseband signal to a transmission band signal by mixing the baseband signal with a carrier signal. In a conventional upconverter/mixer circuit, DC offsets of circuitry driving the mixer, as well as a DC offset in an input stage of the mixer, contribute to generation of carrier leakage. This leakage can corrupt the modulation or otherwise lead to non-compliance with specifications for standardized systems such as wireless networks and cell phones.

In order to reduce such offsets, the devices in the circuit are made large to improve matching. This large size leads to large die area, increased costs, and increased power consumption. Furthermore, in many RF mixers, it is not practical to sense the DC offset at the output, as such circuitry would unduly load the circuit.

As a result, there remains a need for an improved mixer circuit.

SUMMARY

An embodiment includes a circuit including a subcircuit having differential signals, and a feedback circuit coupled to the subcircuit. The feedback circuit is configured to measure an offset between the differential signals, to generate a calibration signal in response to the measurement, and to reduce the offset in response to the calibration signal.

DETAILED DESCRIPTION

Figure 1:
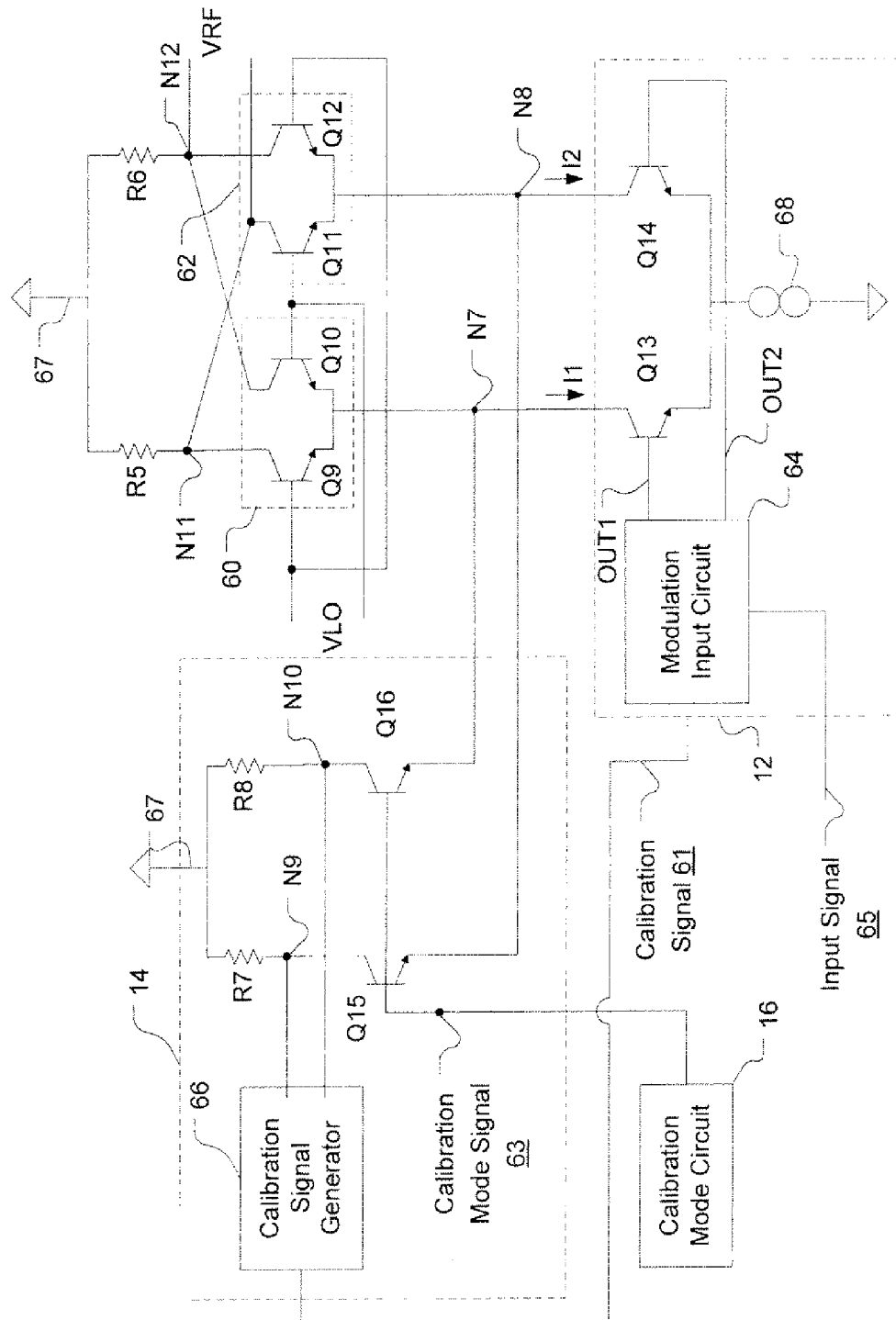
FIG. 1 is a diagram showing a mixer with offset calibration circuitry according to an embodiment.

FIG. 1 is a diagram showing a mixer with offset calibration circuitry according to an embodiment. The mixer includes a first differential pair 60 and a second differential pair 62. The first differential pair 60 includes transistors Q9 and Q10, and is coupled to node N7. The second differential pair 62 includes transistors Q11 and Q12 and is coupled to node N8. The differential pairs 60 and 62 are cross-coupled to each other. Thus, the collector of Q9 is coupled to the collector of Q11 through node N11. Similarly, the collector of Q10 is coupled to the collector of Q12 through node N12. A differential local oscillator input VLO for the mixer is coupled to the transistors Q9-Q12. Resistor R5 is coupled to node N11. Resistor R6 is coupled to node N12. Nodes N11 and N12 form a differential RF output VRF for the mixer.

An input stage 12 is coupled to nodes N7 and N8, and is configured to receive a calibration signal 61 and an input signal 65. In the input stage 12, transistors Q13 and Q14 are coupled to node N7 and node N8, respectively, and coupled to current source 68. A modulation input circuit 64 is coupled to transistors Q13 and Q14. The modulation input circuit 64 is configured to combine an input signal 65 and a calibration signal 61 to generate a first output OUT1 and a second output OUT2. The first output OUT1 and the second output OUT2 drive the transistors Q13 and Q14, respectively.

The modulation input circuit 64 may combine the input signal 65 and the calibration signal 61 through a variety of circuit structures. For example, the input signal 65 may be a differential input signal. A resistor network may combine the calibration signal with one of the signals of the differential input signal, introducing an offset. Thus, when the differential input signals are applied to the transistors Q13 and Q14 as the outputs of the modulation input circuit 64 OUT1 and OUT2, one will have the offset. As a result of the offset introduced by the calibration signal 61, an offset between currents I1 and I2 due to any component or signal prior to nodes N7 and N8 may be reduced or eliminated.

In another example, the calibration signal 61 may be applied to both signals of a differential input signal. For example, the calibration signal 61 may be combined with a first signal of the differential signal to generate the first output OUT1. An inverted version of the calibration signal 61 may be combined with a second signal of the differential signal to generate the second output OUT2. Thus, the calibration signal is applied differentially to transistors Q13 and Q14.

Although using resistors has been described as combining the input and the calibration signal, one skilled in the art will understand that a variety of other circuit structures including components other than or in addition to resistors may be used to combine the calibration signal with the input signal. For example, other components may include capacitors, transistors, inductors, diodes, couplers, or the like.

A feedback circuit 14 is coupled to nodes N7 and N8, and the input stage 12. The feedback circuit is configured to generate the calibration signal 61. The feedback circuit 14 includes transistors Q15 and Q16, resistors R7 and R8, and calibration signal generator 66. Transistor Q15 is coupled to node N9, a calibration mode circuit 16, and node N8. Transistor Q16 is coupled to node N10, the calibration mode circuit 16, and node N7. Resistor R7 is coupled between node N9 and the power supply 67. Resistor R8 is coupled between node N10 and the power supply 67. The calibration signal generator 66 is coupled to nodes N9 and N10, and the modulation input circuit 64. The calibration signal generator 66 is configured to generate the calibration signal 61. In one embodiment, the calibration signal generator 66 is configured to generate the calibration signal 61 in response to a first voltage on node N9 and a second voltage on node N10.

A calibration mode circuit 16 may be coupled to the feedback circuit 14 and configured to generate a calibration mode signal 63. The calibration mode signal 63 may indicate multiple modes of operation, including a calibration mode and an operating mode. The feedback circuit 14 is configured to operate in response to the calibration mode signal 63. In this example, the feedback circuit 14 is configured to generate the calibration signal 61 based on the first current and the second current when the calibration mode signal indicates a calibration mode. The feedback circuit 14 is also configured to sustain the calibration signal 61 when the calibration mode signal 63 indicates an operating mode.

The transistors Q13 and Q14 may, but need not be relatively large devices. Such an increase in size may be used to improve the mismatch between currents I1 and I2. However, such matching would not affect the mismatch introduced by components in the signal path prior to transistors Q13 and Q14. The feedback circuit 14 may still be used to further reduce a DC offset between currents I1 and I2 without increasing the size of other devices to improve matching. Thus, even though some devices have an increased size, the resulting chip area is still reduced as compared with a circuit using additional larger devices within the signal path to reduce an offset.

Resistors R7 and R8 may be increased in size to improve matching. Furthermore, although an increase in size has been described as improving matching of various components, one skilled in the art will understand that other matching techniques, such as device placement or layout may be used as desired.

An embodiment for calibrating mixer offsets operates as follows. A local oscillator signal is applied to transistors Q9-12 as VLO. In this example, VLO is the carrier for the desired modulation. An input is applied to the modulation input circuit 64. The modulation input circuit 64 drives transistors Q13 and Q14 according to the input signal 65 and the calibration signal 61. As a result, currents I1 and I2 are modulated according to the input signal 65.

Figure 4:
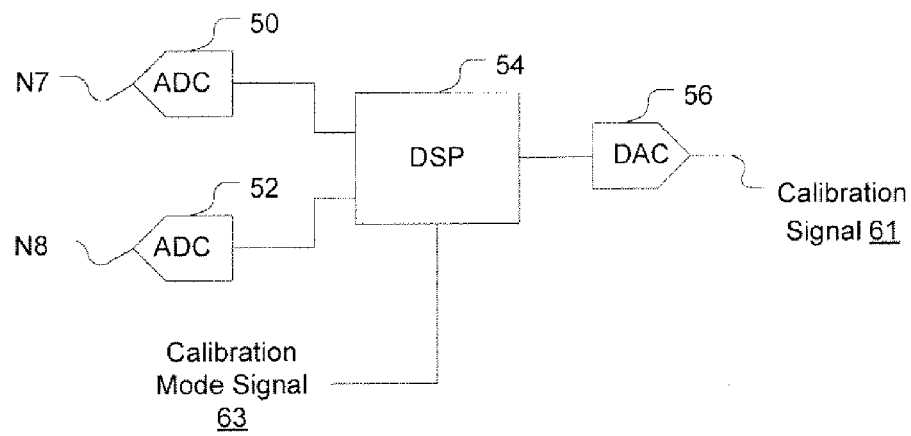
FIG. 4 is a diagram showing another example of a feedback circuit of FIG. 1.

As described above, there may be a DC offset between the currents I1 and I2. In a calibration mode, a calibration mode signal 63 is driven high from the calibration mode circuit 16. As a result, transistors Q15 and Q16 of the feedback circuit 14 shown in FIG. 4 are turned on. At least a portion of the currents I1 and I2 are redirected to the feedback circuit 14. Although in practice, some to all of the currents I1 and I2 will flow to the feedback circuit 14 in the calibration mode, the following discussion will describe operations as if all of the currents I1 and I2 were redirected to the feedback circuit 14. One skilled in the art will understand that references to the currents I1 and I2 as redirected to the feedback circuit 14 may refer to any portion of the currents.

In this example, when transistors Q15 and Q16 are turned on, currents I1 and I2 flow through resistors R7 and R8, respectively. As a result voltages are generated on nodes N9 and N10 that are proportional to the currents I1 and I2, respectively. Assuming that resistors R7 and R8 are approximately equal in resistance, a difference in voltage at nodes N9 and N10 will be approximately proportional to a difference in current flowing through transistors Q15 and Q16. Any offset between the voltages on nodes N9 and N10 reflect an offset between the currents I1 and I2 that may result in carrier leakage on the VRF output of the output stage. The calibration signal generator 66 generates the calibration signal 61. The calibration signal 61 is applied to the modulation input circuit 64 of the input stage 12. As a result, the outputs of the modulation input circuit 64 are adjusted, reducing the DC offset between the voltages on the nodes N9 and N10, and consequently, the currents I1 and I2.

Although resistors R7 and R8 have been described as being approximately equal in resistance, resistors R7 and R8 may be differently sized as desired for detection of an offset between currents I1 and I2. For example, the calibration signal generator 66 may have different input impedances or scale voltages on nodes N9 and N10 differently. Thus, resistors R7 and R8 may have resistances selected such that the feedback circuit 14 may compare an offset between currents I1 and I2.

Thus, by diverting the currents I1 and I2, a DC offset between the currents I1 and I2 may be reduced. Such a DC offset may be a result of a variety of factors, including component mismatches, imbalanced signal levels, or the like. However, regardless of the source or relative contribution of particular sources to the DC offset, the DC offset between the currents I1 and I2 may be reduced.

Figure 2:
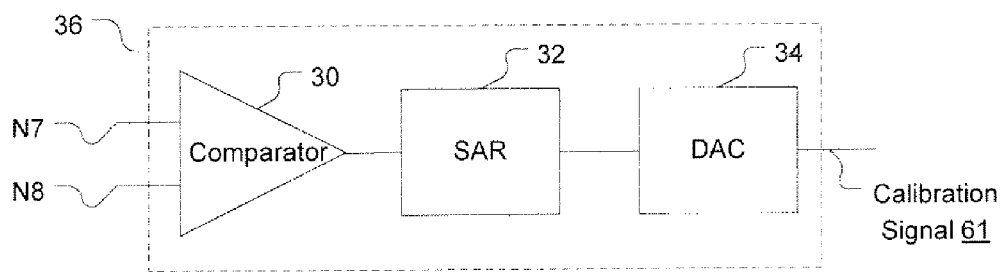
FIG. 2 is a diagram showing another example of the feedback circuit of FIG. 1.

FIG. 2 is an example of a successive approximation circuit 36 as the feedback circuit 14 of FIG. 1. The successive approximation circuit 36 includes a comparator 30, a successive approximation register (SAR) 32, and a digital to analog converter (DAC) 34. The comparator 30 is coupled to the nodes N7 and N8, and the SAR 32. The SAR 32 is coupled to the DAC 34. The DAC 34 generates the calibration signal 61.

In one embodiment, the comparator 30 compares the currents flowing through the nodes N7 and N8. The comparator 30 may include resistors R7 and R8, and transistors Q15 and Q16 of FIG. 1 to generate voltages on node N9 and node N10. The comparator 30 then generates a comparison between the two voltages and outputs the comparison to the SAR 32.

Although components of FIG. 1 have been used to describe potential components and functionality of the comparator 30 of FIG. 2, other components and comparison techniques may be used. For example, the comparator 30 may be a current comparator, comparing currents I1 and I2, rather than converting the currents to voltages.

In this example, the comparison generated by the comparator 30 is a digital signal indicating which of the currents I1 or I2 is greater. With each comparison of the comparator 30, a bit of the SAR 32 is updated. The updated SAR 32 drives the DAC 34. The DAC 34 generates the calibration signal 61. As a result, the offset between the currents I1 and I2 is adjusted. The sequence repeats with a new comparison generated using the updated offset until all bits of the SAR 32 are determined. The end result of the SAR 32 and the resulting calibration signal 61 from the DAC 34 is a reduced DC offset between the currents of node N1 and N2.

Figure 3:
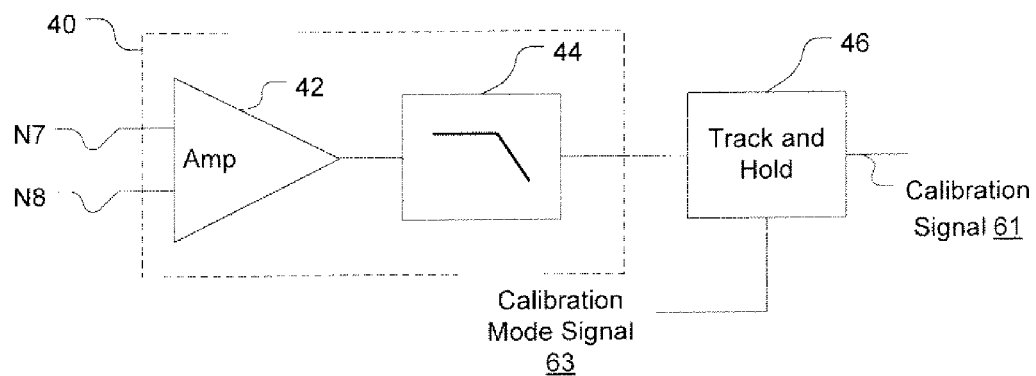
FIG. 3 is a diagram showing another example of the feedback circuit of FIG. 1.

FIG. 3 is a diagram showing another example of the feedback circuit 14 of FIG. 1. The feedback circuit 14 illustrated in FIG. 3 includes an analog control circuit 40 and a track and hold circuit 46. The analog control circuit includes an amplifier 42 and a filter 44. The amplifier 42 amplifies a difference between the nodes N7 and N8. As described above, such a difference may be a voltage difference or a current difference. The amplified output is filtered in the filter 44.

In this example, the filter 44 is illustrated as discrete from the amplifier 42. However, one skilled in the art will understand that the filter 44 may be integrated with the amplifier 42 such that the frequency response of the amplifier 42 forms the desired frequency response of the filter 44. Furthermore, although a symbol for a low pass filter has been illustrated in FIG. 3, the filter may be of any shape as desired to achieve a desired response of the feedback circuit 14.

In another example, the filtered output drives the track and hold circuit 46. The track and hold circuit 46 is responsive to the calibration mode signal 63. In a calibration mode, the track and hold circuit 46 is in track mode. As a result, the output of the track and hold circuit 46 tracks the input. Thus, the output of the filter 44 becomes the calibration signal 61 through the track and hold circuit 46.

After the calibration signal 61 has settled, the track and hold circuit 46 may be put into hold mode. For example, the calibration mode signal 63 may transition to an operating mode and in response, the track and hold circuit 46 enters the hold mode. Thus, a steady state calibration signal 61 that resulted in a minimum difference from signals on nodes N7 and N8 during the calibration mode would be maintained in the operating mode.

The circuit may be switched from the operating mode to the calibration mode so that a new calibration signal 61 may be generated to keep the offset at a minimum. For example, if the mixer is used as an upconverting mixer for a wireless device, such a mode switch may occur during a time between transmissions. In between the transmissions in a calibration mode, the calibration signal 61 is generated, reducing DC offsets. During transmissions, the calibration signal 61 is held in the state from the calibration mode, maintaining the reduced DC offsets.

Although an operating mode and a calibration mode have been described above, the modes of the circuit are not limited to such modes. Furthermore, labels of such modes were chosen merely to distinguish in an embodiment when a calibration signal may be modified. Thus, in a calibration mode the circuit may still be operating, and in an operating mode, the circuit may still be calibrated.

FIG. 4 is a diagram showing another example of a feedback circuit of FIG. 1. The feedback circuit illustrated in FIG. 4 includes a first and second analog to digital converters (ADC) 50 and 52, a digital signal processor (DSP) 54, and a DAC 56. The ADCs 50 and 52 are coupled to the DSP 54. The DSP 54 is coupled to the DAC 56. The DAC 56 generates the calibration signal.

The ADCs 50 and 52 sample the nodes N7 and N8. As described above, the signals from nodes N7 and N8 may be voltages or currents. ADCs 50 and 52 and any front end circuitry may be appropriately selected to digitize such signals. For example, if the signals from nodes N7 and N8 are currents, the ADCs 50 and 52 may be current input ADCs. Regardless of the format of the signals from nodes N7 and N8, the signals are digitized in the respective ADCs 50 and 52.

The DSP 54 generates a digitized version of the calibration signal 61. As described above, the calibration signal 61 may be generated in a calibration mode, and maintained in an operating mode. The DSP 54 may have an input for the calibration mode signal 63. Thus, the DSP 54 may maintain the digitized calibration signal in the operating mode. The DAC 56 generates the calibration signal 61 from the digitized calibration signal.

Using the DSP 54, any manner of techniques may be used to reduce the offset between currents I1 and I2. For example, the analog control circuit 40 described above may be approximated with a digital control loop implemented within the DSP 54. Alternatively, the successive approximation circuit 36, described above, may be implemented in the DSP 54. Furthermore, any digital control technique may be implemented in the DSP to adjust the digitized calibration signal in response to the digitized signals from the nodes N7 and N8.

Although the ADCs 50 and 52, and the DAC 56 have been illustrated as separate from the DSP 54, any combination of the ADCs 50 and 52, and the DAC 56 may be part of the DSP 54. Furthermore, the DSP 54 need not be a processor solely designed for digital signal processing. For example the DSP 54 may be a general purpose processor. In addition, the DSP 54 need not be labeled a digital signal processor. Any circuitry that may manipulate digital signals may be used as a DSP 54. For example, a field programmable gate array (FPGA), a programmable logic device (PLD), or the like may be used as a DSP 54.

As described above, the calibration signal 61 may be generated during a calibration mode. When the mixer is in an operating mode, the calibration signal 61 may be maintained. Alternatively, the calibration circuitry may be operated continuously. As described above, various implementations of analog and digital filters may be used. The filters may be implemented such that the offset reducing effect of the control loop does not affect the modulation input signal. For example, if a particular modulation input signal does not have significant frequency components below a particular frequency, 10 kilohertz (KHZ) for example, the bandwidth of the control loop may be selected to have a cutoff frequency of less than 10 KHz. Thus, frequency components of the difference of currents I1 and I2 having frequencies from DC to the cutoff frequency of the control loop may be reduced. However, frequency components of the modulation input signal contributing to the currents I1 and I2 that are higher than the cutoff frequency would not be affected. As a result, the DC offset between currents I1 and I2 may be continuously reduced.

Figure 5:
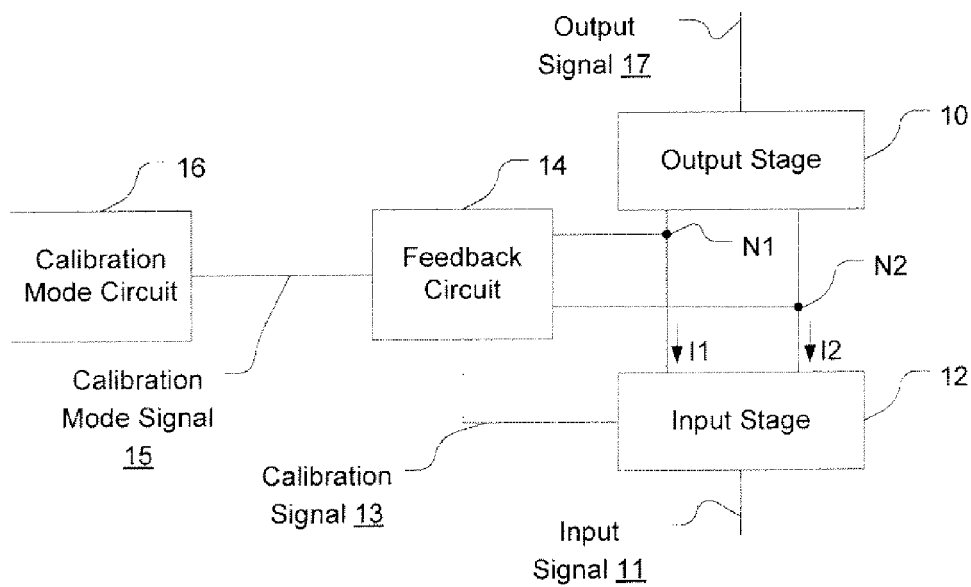
FIG. 5 is a diagram showing a circuit for calibrating offsets according to another embodiment.

FIG. 5 is a diagram showing a circuit for calibrating offsets according to another embodiment. The circuit includes an output stage 10 coupled to a node N1 and a node N2. An input stage 12 is coupled to the node N1 and the node N2. The input stage 12 is configured to receive an input signal 11. A feedback circuit 14 is coupled to the node N1, the node N2, and the input stage 12. The feedback circuit is configured to generate a calibration signal 13.

Although the components of FIG. 1 have been described as being part of a mixer, other components may form the input stage 12 and output stage 10. For example, analog multipliers or other implementations or applications of a Gilbert cells, for uses other than mixers, may include nodes N1 and N2 where a DC offset between currents I1 and I2 would result in an imbalance in the output signal 17.

In addition, although throughout this disclosure, in reference to current, the terms "from", "to", "into", and other directional terms may be used, one skilled in the art will understand that components may be used in an embodiment such that the direction of the current is reversed. For example, currents may be described in one embodiment as flowing from the input stage 12. In another embodiment, currents may flow into the input stage 12. Furthermore, all currents in an embodiment may, but need not be similarly reversed.

Figure 6:
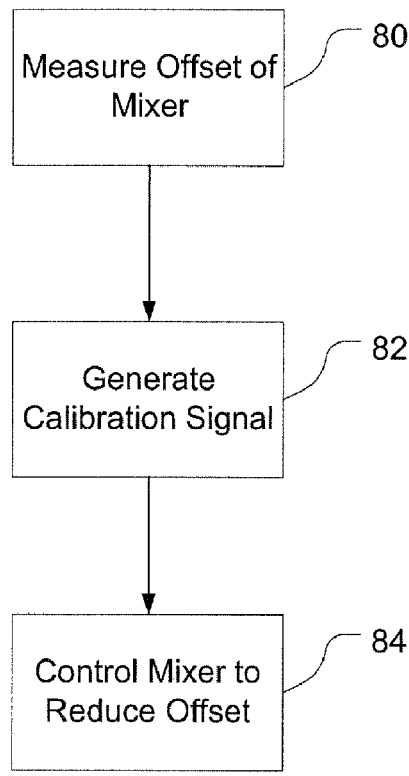
FIG. 6 is a flowchart showing how a mixer offset is calibrated according to another embodiment.

FIG. 6 is a flowchart showing calibrating mixer offsets according to another embodiment. An offset internal to the mixer is measured in 80. The measurement in 80 may be performed using a variety of techniques. For example, the currents may be converted into voltages and the voltages may be compared. Alternatively, the currents may be directly compared. Furthermore, any such current or voltage used for a comparison may be digitized, with the digitized values being compared. As used in this discussion, comparing a first current and a second current for the measurement in 80 may include a digital measurement. Thus, the measurement may generate a digital output have two or more possible states.

Alternatively, the first current and the second current in 80 may include an analog measurement. Thus, the measurement may generate an analog output with a continuous spectrum of possible output states.

In response to the measurement, a calibration signal is generated in 82. The calibration signal may be generated in a variety of ways. For example, as described above, the calibration signal may be generated in 82 by analog techniques, digital techniques, or a combination of such techniques.

The mixer is controlled to reduce the offset using the calibration signal in 84. To control the offset of the mixer, at least one signal in the input stage may be modified. Such modification may include adding, subtracting, or otherwise combining the calibration signal to the signal in the input stage. The calibration signal may modify only one signal, or may modify multiple signals in the input stage. For example, with a differential input stage, two input signals drive the input stage. Thus, the two input signals, as they exist in the input stage, may be modified by the calibration signal. In particular, for differential signals, a first one of the differential signals may be increased and a second one of the differential signals may be decreased to reduce the offset in the mixer in 84.

The measuring of the offset in 80, the generation of the calibration signal in 82, and the controlling of the mixer in 84 may be repeated to minimize the offset of the mixer.

Figure 7:
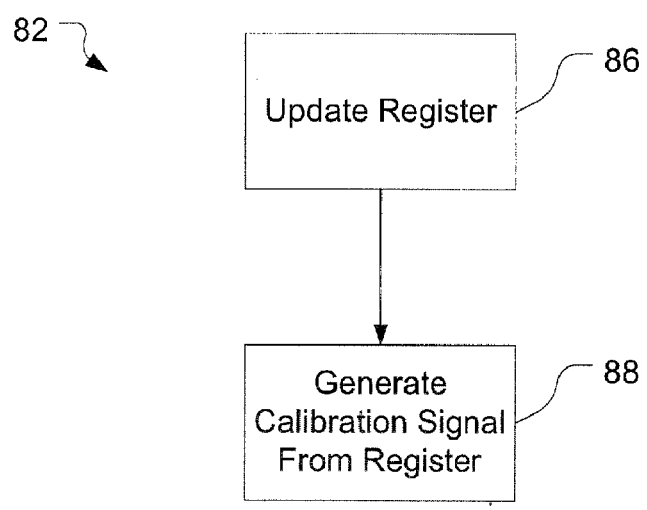
FIG. 7 is a flowchart showing how a register is updated to calibrate a mixer offset according to another embodiment.

FIG. 7 is a flowchart showing how a register is updated to calibrate a mixer offset according to another embodiment. In 86, a value in a register is updated in response to the measurement in 80. This value is used to generate the calibration signal in 88. In one example, as described above, the calibration signal may be generated using a successive approximation register (SAR). Thus, in response to the measurement in 80, a bit of the SAR is updated. The value in the SAR is used to generate the calibration signal.

Figure 8:
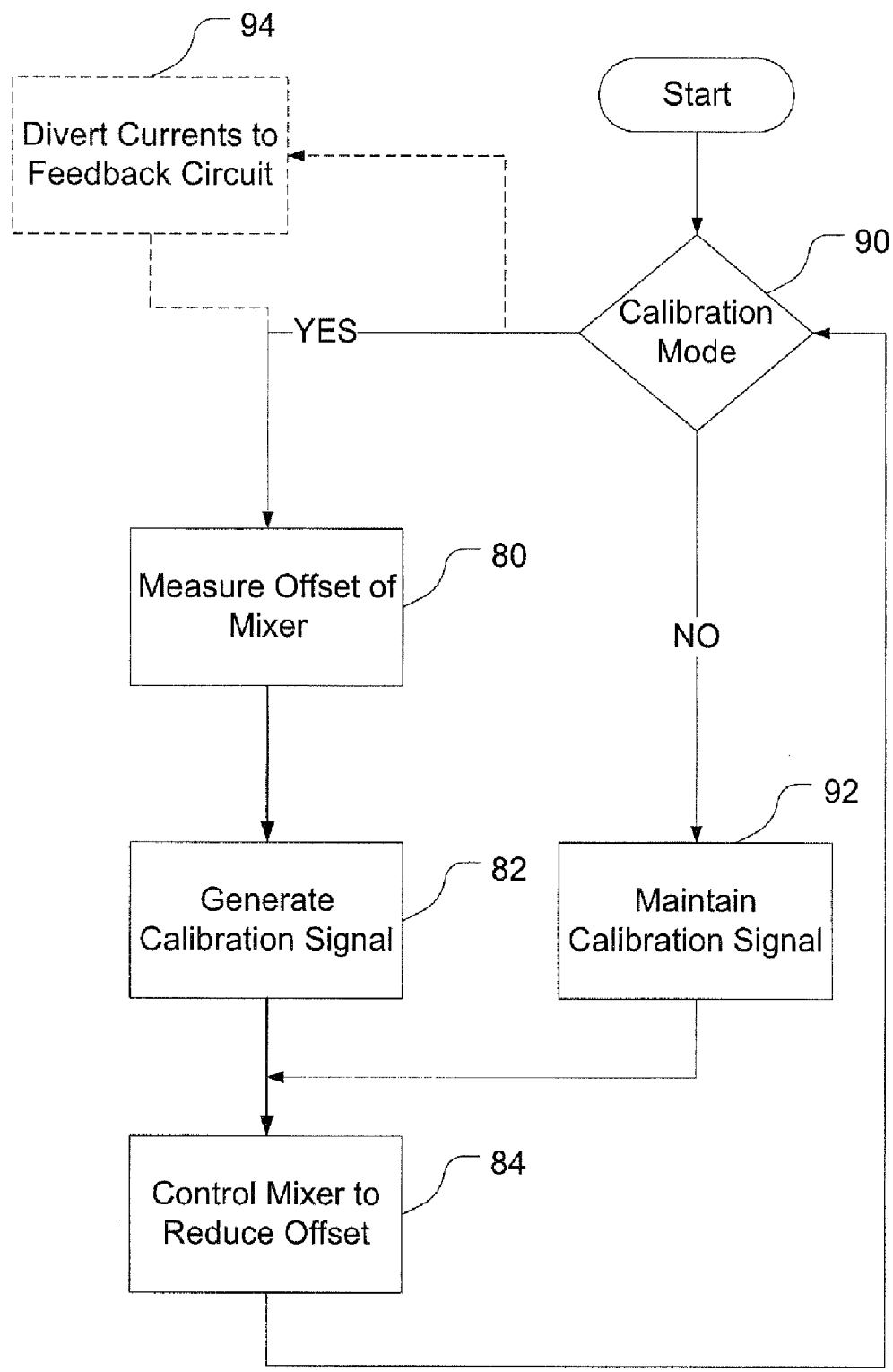
FIG. 8 is a flowchart showing how a mixer offset is calibrated in various modes according to another embodiment.

FIG. 8 is a flowchart showing how a mixer offset is calibrated in various modes according to another embodiment. As described above, the mixer may be in a variety of modes, including a calibration mode, and an operating mode. It is determined if the mode is a calibration mode in 90. If the mode is the calibration mode, then as described above, the offset is measured in 80, the calibration signal is generated in 82, and the mixer is controlled in 84.

In contrast, if the mode is not the calibration mode, the calibration signal is maintained in 92. The calibration mode may be maintained using a variety of techniques. For example, as described above, with an analog control loop generating the calibration signal, an analog track and hold circuit may hold the analog calibration signal in order to maintain the calibration signal in 92. Alternatively, if a digital control loop is used, the digitized value used to generate the calibration signal may be held constant. Furthermore, a combination of analog and digital techniques may be used. For example, the analog calibration signal may be digitized during the calibration mode. In the operating mode, the last digitized calibration signal may be used to generate the calibration signal, thus, maintaining it.

In the calibration mode, a first current and a second current from an input stage of the mixer flow to an output stage of the mixer. To make the measurement of the offset in 80, at least a portion of the first and second currents may be diverted to a calibration signal feedback circuit in 94. For example, when a calibration mode is entered, transistors are turned on so that the first and second currents flow through resistors coupled to the transistors. Thus, the first and second currents are diverted in 94 and measured in 80.

Although one type of transistor has been illustrated in the drawings, the transistors described above can be any type. For example, the transistors may be bipolar (NPN or PNP), metal-oxide-semiconductor MOS (N- or P-channel), or the like.

For purposes of clarity, many of the details of the improved solution and the methods of designing and manufacturing the same that are widely known and are not relevant to the present invention have been omitted from the following description.

Furthermore, it should be appreciated that reference throughout this specification to "one embodiment" or "an example" means that a particular feature, structure or characteristic described in connection with the embodiment is included in at least one embodiment and may, but need not be included in all embodiments. Therefore, it is emphasized and should be appreciated that two or more references to "an embodiment" or "one embodiment" or "another embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that more features are required than are expressly recited in each claim. Thus, the claims following the detailed description are hereby expressly incorporated into this detailed description, with each claim standing on its own as a separate embodiment of this invention. Furthermore, although particular embodiments have been described, one skilled in the art will appreciate that various modifications may be made without departing from the scope of the following claims.

The invention claimed is:

1. A mixer, comprising:
 a first differential transistor pair coupled to a first node;
 a second differential transistor pair cross-coupled to the first differential transistor pair and coupled to a second node;
 a third differential transistor pair coupled to the first and second nodes;
 a feedback circuit coupled to the first node and the second node, and configured to generate a calibration signal based on a measured signal offset between the first and second nodes during both a calibration mode and an operating mode;
 a modulation input circuit coupled to the third differential transistor pair, and responsive to the calibration signal, wherein the modulation input circuit is configured to receive an input signal having substantially all desired frequency components above a first cut-off frequency; and
 a control loop formed by the feedback circuit and the modulation input circuit, the control loop having a bandwidth from DC to a second cut-off frequency that is less than the first cut-off frequency.

2. The mixer of claim 1, wherein the feedback circuit further comprises:
 a first resistor coupled between a power supply and a third node;
 a second resistor coupled between the power supply and a fourth node;
 a first transistor coupled between the first node and the third node; and
 a second transistor coupled between the second node and the fourth node.

3. The mixer of claim 2, wherein the feedback circuit is further configured to generate the calibration signal in response to a first voltage on the third node and a second voltage on the fourth node.

4. The mixer of claim 3, wherein the feedback circuit is further configured to adjust the calibration signal in a calibration mode until the first voltage and the second voltage are substantially equivalent.

5. The mixer of claim 4, wherein the feedback circuit further comprises a successive approximation feedback loop.

6. A circuit, comprising:
a subcircuit having differential signals;
a feedback circuit coupled to the subcircuit, and configured to measure a direct current offset between the differential signals, to generate a calibration signal in response to the measurement during both a calibration mode and an operating mode and to reduce the offset in response to the calibration signal;
a modulation input circuit coupled to the subcircuit, and configured to receive an input signal having substantially all desired frequency components above a first cut-off frequency; and
a control loop formed by the feedback circuit and the modulation input circuit, the control loop having a bandwidth from DC to a second cut-off frequency that is less than the first cut-off frequency.

7. The circuit of claim 6, wherein the subcircuit further comprises:
a first transistor coupled between a third node and a first node;
a second transistor coupled between a fourth node and the first node;
a third transistor coupled between the third node and a second node;
a fourth transistor coupled between the fourth node and the second node;
a first resistor coupled between the third node and a power supply; and
a second resistor coupled between the fourth node and the power supply;
wherein the differential signals pass through the first and second nodes.

8. The circuit of claim 6, wherein the
modulation input circuit is configured to generate a first output and a second output in response to the calibration signal and the input signal; and the subcircuit further comprises:
a first transistor coupled to a first node and responsive to the first output; and
a second transistor coupled to a second node and responsive to the second output;
wherein the differential signals pass through the first and second nodes.

9. The circuit of claim 6, wherein the feedback circuit further comprises:
a first resistor coupled between a power supply and a third node;
a second resistor coupled between the power supply and a fourth node;
a first transistor coupled between the third node and the first node;
a second transistor coupled between the fourth node and the second node; and
a calibration signal generator configured to generate the calibration signal in response to a first voltage on the third node and a second voltage on the fourth node.

10. The circuit of claim 9, further comprising:
a calibration mode circuit coupled to the first transistor and the second transistor, and configured to generate a calibration mode signal;
wherein each of the first transistor and the second transistor is responsive to the calibration mode signal.

11. The circuit of claim 6, wherein the feedback circuit further comprises:
a successive approximation circuit coupled to a first node and a second node, and configured to generate the calibration signal;
wherein the differential signals pass through the first and second nodes.

12. The circuit of claim 6, wherein the feedback circuit further comprises:
an analog control circuit coupled to a first node and a second node, and configured to generate a control signal; and
a track and hold circuit coupled to the analog control circuit and configured to track and hold the control signal to generate the calibration signal;
wherein the differential signals pass through the first and second nodes.

13. The circuit of claim 6, wherein the feedback circuit further comprises:
a first analog to digital converter coupled to a first node and configured to generate a first digital signal in response to the first node;
a second analog to digital converter coupled to a second node and configured to generate a second digital signal in response to the second node;
a digital signal processing circuit coupled to the first and second analog to digital converters and configured to generate a digitized calibration signal; and
a digital to analog converter coupled to the digital signal processing circuit and configured to generate the calibration signal in response to the digitized calibration signal;
wherein the differential signals pass through the first and second nodes.

14. A method of calibrating a mixer, comprising:
measuring a direct current offset between a first node and a second node internal to the mixer;
generating a calibration signal in response to the measurement during both a calibration mode and an operating mode;
controlling the mixer with the calibration signal to reduce the offset;
applying a local oscillator signal to the mixer; and
applying a modulation signal to the mixer, the modulation signal having substantially all desired frequency components above a first cut-off frequency;
wherein controlling the mixer with the calibration signal comprises controlling the mixer with a control loop while applying the local oscillator signal and the modulation signal to the mixer, the control loop having a bandwidth from DC to a second cut-off frequency that is less than the first cut-off frequency.

15. The method of claim 14, further comprising:
updating a value in a register in response to the measurement; and
generating the calibration signal corresponding to the value in the register.

16. The method of claim 14, further comprising:
generating the calibration signal by comparing a first current at a first node of a first differential transistor with a second current at a second node of a second differential transistor; and
adjusting the calibration signal until the first current and the second current are substantially equivalent.

17. The method of claim 14, further comprising:
entering a calibration mode; and
diverting at least a portion of a first current and a second current from the mixer to a calibration signal feedback circuit.

\* \* \* \* \*